(12) United States Patent
Hasegawa

(10) Patent No.: US 7,307,470 B2
(45) Date of Patent: Dec. 11, 2007

(54) SEMICONDUCTOR DEVICE WITH LEAKAGE CURRENT COMPENSATING CIRCUIT

(75) Inventor: Masaru Hasegawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/270,480

(22) Filed: Nov. 10, 2005

(65) Prior Publication Data
US 2006/0097774 A1   May 11, 2006

(30) Foreign Application Priority Data
Nov. 11, 2004   (JP)   ............... 2004-328254

(51) Int. Cl.
*G05F 1/10*   (2006.01)
*G05F 3/02*   (2006.01)

(52) U.S. Cl. ...................... 327/543; 327/544

(58) Field of Classification Search ............... 327/538, 327/540, 541, 543; 323/315
See application file for complete search history.

(56) References Cited

U.S. PATENT DOCUMENTS

| | | | |
|---|---|---|---|
| 4,216,394 A | 8/1980 | Leidich | 327/540 |
| 4,613,772 A | 9/1986 | Young | 326/32 |
| 4,769,559 A * | 9/1988 | Mahabadi | 327/546 |
| 5,418,751 A | 5/1995 | Kaiser | 365/211 |
| 6,940,338 B2 * | 9/2005 | Kizaki et al. | 327/543 |
| 2003/0184359 A1 | 10/2003 | Gammie et al. | 327/379 |
| 2005/0088245 A1 * | 4/2005 | Isobe | 331/57 |

FOREIGN PATENT DOCUMENTS

| | | |
|---|---|---|
| EP | 0 459 715 A2 | 12/1991 |
| JP | 04257906 A * | 9/1992 |
| JP | 11-26694 A | 1/1999 |

OTHER PUBLICATIONS

Gebara F H et al.: "Accurate current mirroring in the presence of gate leakage current" Oct. 4, 2004, SOI Conference, 2004. Prcoeedings. p. 117, XP010766954 ISBN: 0-7803-8497-0 *p. 117 right-column, lines 3-10 pp. 3, lines 16-20 pp. 3.

Mizuno K et al., "Analog CMOS integrated circuits for high-temperature operation with leakage current compensation" High Temperature Electronics Conference 1998. Jun. 14, 1998 pp. 41-44, XP010281928 ISBN 0-7803-4540-1.

* cited by examiner

*Primary Examiner*—Quan Tra
(74) *Attorney, Agent, or Firm*—Sughrue Mion. Pllc.

(57) ABSTRACT

A semiconductor device includes a current mirror circuit having a plurality of transistors; a current source configured to supply a constant reference current to the current mirror circuit through a node; and a compensating circuit configured to supply a compensation current to the node to compensate for at least a part of gate leakage currents of the plurality of transistors. The compensating circuit may supply the compensation current equal to a summation of the gate leakage currents.

8 Claims, 7 Drawing Sheets

SEMICONDUCTOR DEVICE WITH LEAKAGE CURRENT COMPENSATING CIRCUIT

BACKGROUND OF THE INVENTION

1. Field of the Invention

The present invention relates to a semiconductor device. More specifically, the present invention relates to a semiconductor device including a circuit that compensates for a gate leakage current.

2. Description of the Related Art

In present information technology society, presence of computers is indispensable, and the computers having higher performances are desired. An information processing ability of a computer is greatly influenced by a performance of semiconductor devices installed into the computer. To improve the performance of the computer, the semiconductor device of a higher integration is demanded, which is realized by reducing size of a MOS transistor that constitutes the semiconductor device.

When the MOS transistor is reduced in size, it is required to make a gate insulating film thinner. As a result, a power supply voltage $V_{DD}$ must be lowered to prevent breakdown of the transistor. In such a case, the characteristics of the semiconductor device such as high speed operation would be deteriorated unless a threshold voltage of the MOS transistor is reduced. If the threshold voltage is reduced, the performance can be improved, but a leakage current (off-leak current) flowing from a drain to a source increases in the OFF state of the transistor.

Also, if the MOS transistor is reduced in size, the gate length of the MOS transistor becomes shorter, so that a short channel effect occurs, that is, the control of a channel region by a gate field is weakened so that the threshold voltage is reduced because of the smaller gate length. To suppress this short channel effect, various techniques are known. For example, impurity concentration in a channel region and a pocket region may be increased, but an interband tunnel leakage current flowing between a drain electrode and a substrate increases. Also, in another technique, the gate length may be increased. However, in this case, a high speed operation cannot be achieved. In a portion other than a circuit portion in which a high speed operation is required, e.g., a bias circuit, a transistor having a long gate length may be used. In this case, however, the gate leakage current that flows through the oxide film increases. Consequently, the gate leakage current is further increased. As a result, a desired bias point cannot be obtained.

As can be seen from the above, it is strongly demanded to eliminate the problem of the increase in leakage current.

A technique for compensating for the leakage current of the MOS transistor is known in Japanese Laid Open Patent Publication (JP-A-Heisei 11-26694). In this conventional example, a compensating circuit is provided in the semiconductor device to compensate for the leakage current. FIG. 1 is a circuit diagram showing a configuration of the leakage current compensating circuit disclosed in the conventional example. As shown in FIG. 1, the leakage current compensating circuit includes a NMOS transistor 101 and a leakage compensating circuit 102 that compensates for a leakage current of the NMOS transistor 101. The leakage compensating circuit 102 includes an NMOS transistor 103 and a current mirror circuit 104. The conventional leakage current compensating circuit compensates for the leakage current flowing through a parasitic diode in a reverse direction by a current outputted from the current mirror circuit.

As described above, a gate leakage current flows when the thickness of the gate insulating film is thinner, as well as the leakage current caused by the parasitic diode disclosed in the conventional example. The gate leakage current flows due to the tunnel effect as the result of the deterioration in insulating property of the gate insulating film. Therefore, as the size of the MOS transistor is made smaller and smaller, the gate leakage current is considered more serious. Thus, a technique capable of compensating for the gate leakage current is demanded. In addition, it is demanded that the circuit scale of a compensating circuit is small.

SUMMARY OF THE INVENTION

In an aspect of the present invention, a semiconductor device includes a current mirror circuit having a plurality of transistors; a current source configured to supply a constant reference current to the current mirror circuit through a node; and a compensating circuit configured to supply a compensation current to the node to compensate for at least a part of gate leakage currents of the plurality of transistors.

Here, the compensating circuit may supply the compensation current equal to a summation of the gate leakage currents.

The current compensating circuit may include a compensating device having an electrode of an area substantially equal to a summation of gate areas of the plurality of transistors, and configured to generate the compensation current based on a predetermined voltage applied to the electrode of the compensating device. In this case, the compensating device may include a MOS transistor having a gate as the electrode, and a source and a drain connected to each other and connected to the node. The predetermined voltage may be a power supply voltage. Instead, the current compensating circuit may further include a voltage adjusting circuit including first and second resistances connected in series and configured to generate an adjustment bias voltage from a power supply voltage by the first and second resistances and to supply the adjustment bias voltage to the compensating device as the predetermined voltage.

Also, the compensating circuit may include a current supply circuit; and a control circuit configured to control the current supply circuit based on an output voltage of the current supply circuit and a reference voltage at a reference node such that the current supply circuit supplies the compensation current to the node. In this case, the compensating circuit further may include a reference voltage generating circuit configured to supply a current equal to the constant reference current to the reference node; and a MOS transistor having a drain connected with the reference node, a gate connected with the drain and a source connected with a ground. The control circuit compares the output voltage of the current supply circuit and the reference voltage at the reference node and controls the current supply circuit based on the comparing result.

Also, the compensating circuit further may include an activation control circuit configured to allow the current mirror circuit to operate normally in response to a first signal of a first voltage level, and to inhibit the current mirror circuit to operate in response to a second signal of a second voltage level different from the first voltage level. The activation control circuit may include an inverter supplied with a control signal; a first transistor arranged between the node and gates of the plurality of transistors other than a specific transistor in the current mirror circuit, wherein the specific transistor has a drain connected with the node, a gate connected with the drain of the specific transistor and the gates of the plurality of transistor other than the specific transistor and a source connected with a ground; and a control transistor having a gate connected with an output terminal of the inverter, and a drain connected with the gates of the plurality of transistors and a source connected with the ground. The inverter may output a permit signal in response to the first signal to allow the current mirror circuit to operate normally, and output an inhibit signal in response to the second signal to inhibit the current mirror circuit to operate.

In another aspect of the present invention, a method of suppressing gate leakage currents is achieved by supplying a constant reference current from a current source to a current mirror circuit of a plurality of transistors through a node; and by supplying a compensation current from a compensating circuit to said current mirror circuit through said node to compensate for at least a part of gate leakage currents of said plurality of transistors.

Here, said compensation current is preferably equal to a summation of said gate leakage currents.

Also, the semiconductor device may be achieved by further allowing said current mirror circuit to operate normally in response to a first signal of a first voltage level; and further inhibiting said current mirror circuit to operate in response to a second signal of a second voltage level different from said first voltage level.

DESCRIPTION OF THE PREFERRED EMBODIMENTS

Hereinafter, a semiconductor device with a compensating circuit of the present invention will be described with reference to the attached drawings.

First Embodiment

Figure 1:
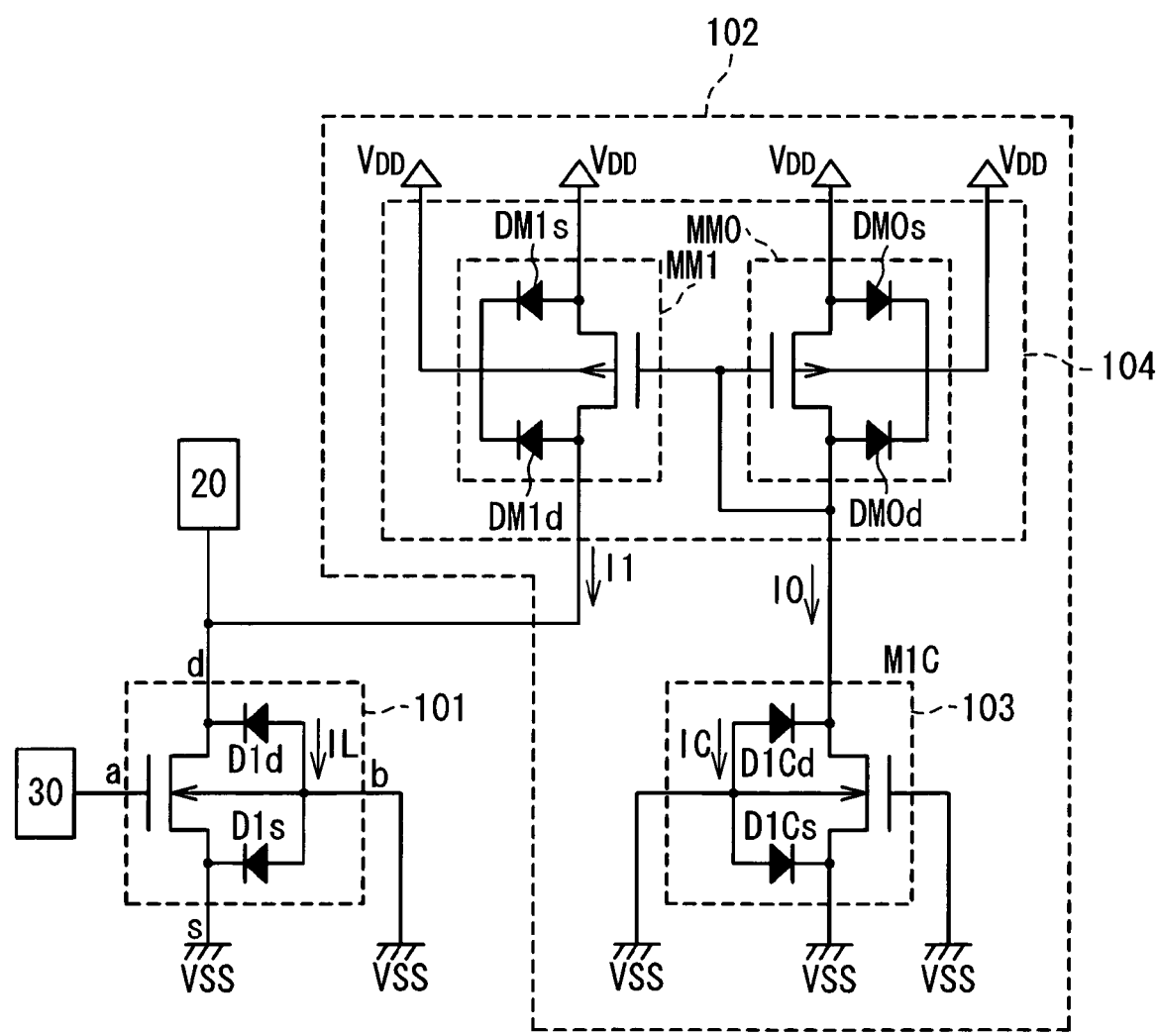
FIG. 1 is a circuit diagram showing a configuration of a conventional leakage current compensating circuit.
Figure 2:
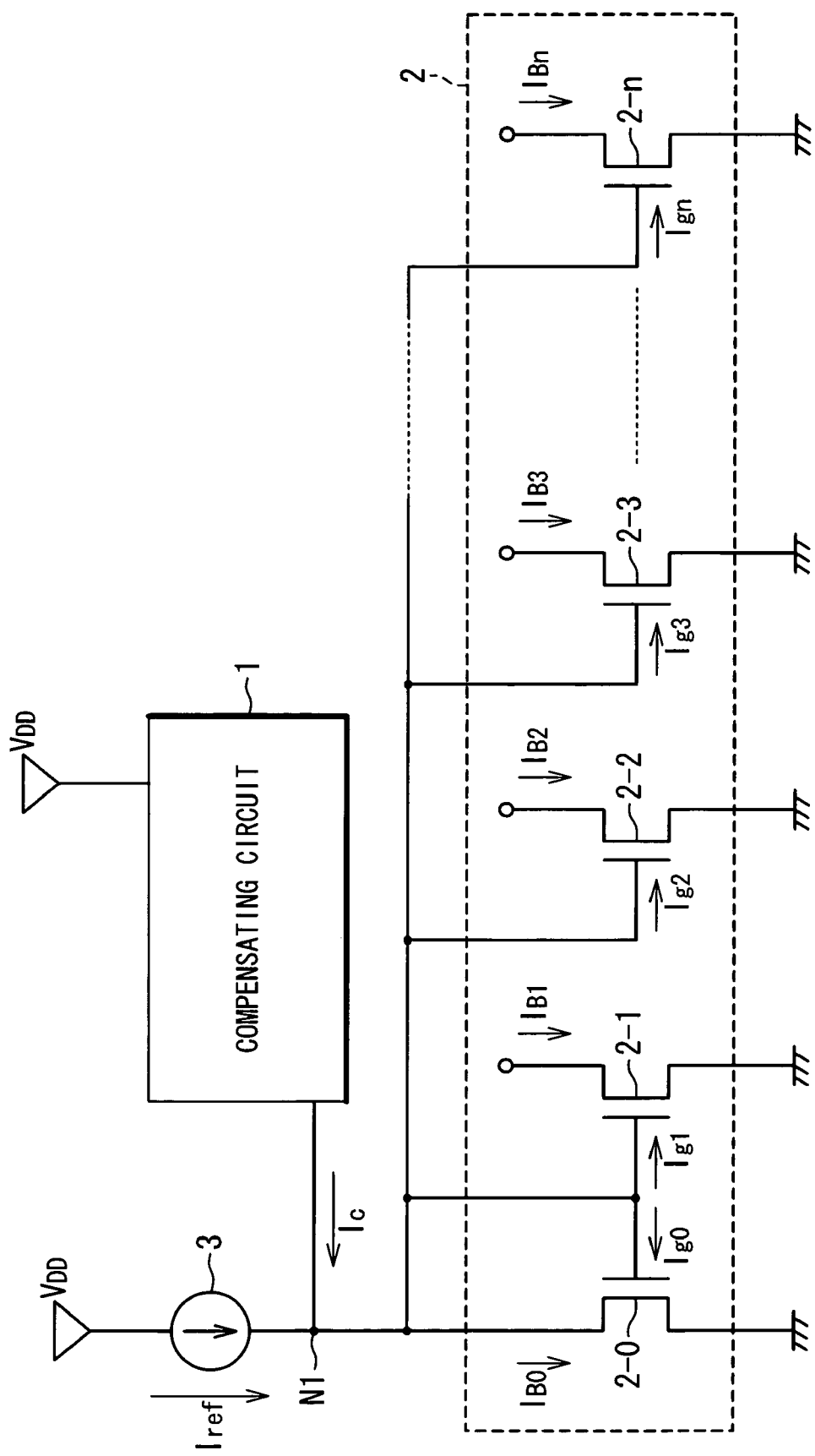
FIG. 2 is a circuit diagram showing the configuration of a gate leakage current compensating circuit according to a first embodiment of the present invention.

FIG. 2 is a circuit diagram showing a configuration of a gate leakage current compensating circuit according to the first embodiment of the present invention. As shown in FIG. 2, the gate leakage current compensating circuit in the first embodiment includes a compensating circuit 1, a current mirror circuit 2, and a current source 3. The compensating circuit 1 is a current generating circuit that generates a compensation current $I_c$ for compensating for a gate leakage current generated in the current mirror circuit 2. In this embodiment, an example that a target circuit of the gate leakage current compensation is configured by the current mirror circuit will be described. It is noted that the present invention is applicable to various circuits that the gate leakage is considered a serious problem. Therefore, the fact that the gate leakage current compensation target circuit is the current mirror circuit does not limit the configuration of the leakage compensation target circuit of the present invention. In addition, in embodiments subsequent to the first embodiment to be described below, components denoted by the same reference symbols are same in configuration to those in the first embodiment. Therefore, these components will not be repeatedly described in detail in the second and the following embodiments.

As shown in FIG. 2, the compensating circuit 1 is connected to a power supply line $V_{DD}$ and the current mirror circuit 2. The compensating circuit 1 generates the compensating current $I_C$ based on a power supply voltage supplied from the power supply line $V_{DD}$, and supplies the generated compensating current $I_C$ to the current mirror circuit 2 through a first node N1. A detailed circuit configuration of the compensating circuit 1 will be described later.

The current mirror circuit 2 generates a plurality of constant currents based on a reference current $I_{ref}$. As shown in FIG. 2, the current mirror circuit 2 is configured to include a plurality of NMOS transistors 2-0 to 2-$n$ (where n is an arbitrary natural number). In the first NMOS transistor 2-0, a gate is connected to a drain. Each of gates of the other NMOS transistors 2-1 to 2-$n$ is connected to the gate of the first NMOS transistor 2-0. Sources of the respective NMOS transistors 2-0 to 2-$n$ are grounded. Gate—source voltages of the respective NMOS transistors 2-0 to 2-$n$ are equal to each other. Therefore, by setting a ratio of a ratio (W/L) of a gate width W of the NMOS transistor 2-0 to a gate length L thereof to each of ratios (W/L) of the remaining NMOS transistors 2-1 to 2-$n$ to a predetermined ratio, a plurality of constant currents, i.e., a constant current $I_{B0}$ flowing through the NMOS transistor 2-0 and constant currents $I_{B1}$ to $I_{Bn}$ having an arbitrary ratio to the constant current $I_{B0}$ can be obtained. These constant current $I_{B1}$ to $I_{Bn}$ are supplied to a logic circuit as operating currents.

In the first embodiment, it is assumed that a ratio of the constant current $I_{B0}$ to each of the constant currents $I_{B1}$ to $I_{Bn}$ is 1:1. In addition, constant currents $I_{g0}$ to $I_{gn}$ shown in FIG. 2 are gate leakage currents flowing through the respective MOS transistors 2-0 to 2-$n$.

The current source 3 is a reference current generating circuit that generates the reference current $I_{ref}$ to be supplied to the current mirror circuit 2. As shown in FIG. 2, the current source 3 is connected to the power supply line $V_{DD}$, and generates the reference current $I_{ref}$ that does not depend on a change in the power supply voltage supplied from the power supply line $V_{DD}$. A detailed circuit configuration of the current source 3 according to the first embodiment will be described later.

Figure 3:
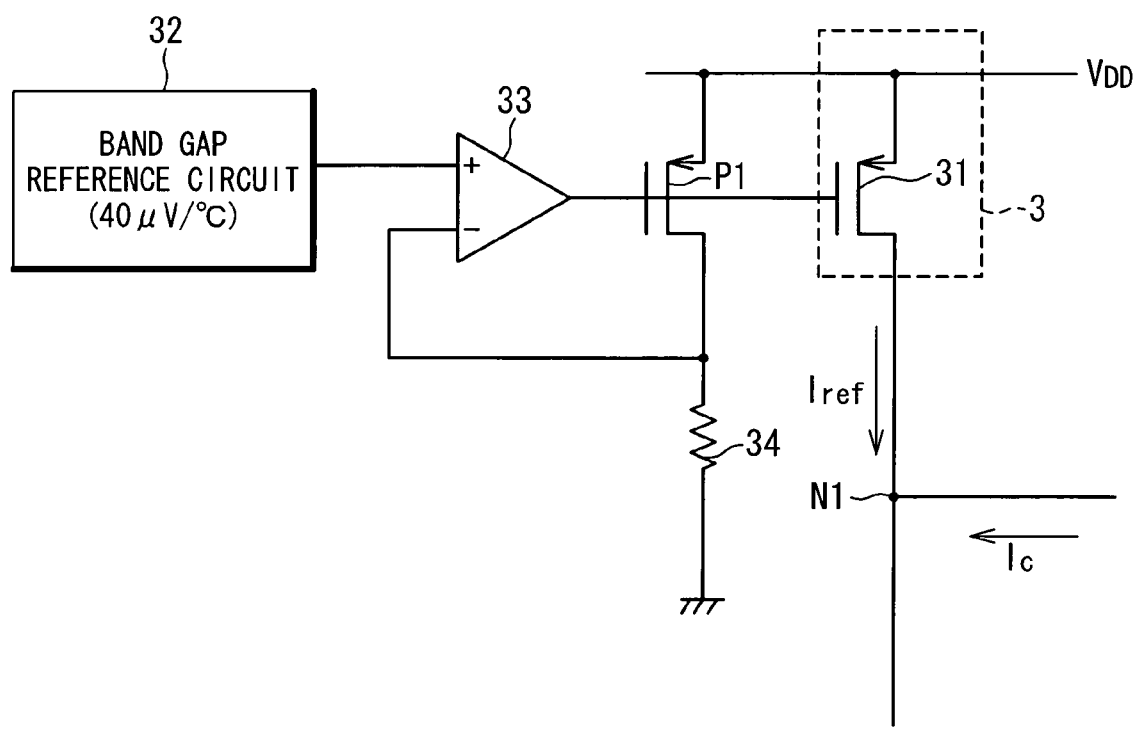
FIG. 3 is a circuit diagram showing the detailed circuit configuration of a current source in the gate leakage current compensating circuit of the first embodiment.

FIG. 3 is a circuit diagram showing a detailed circuit configuration of the current source 3 according to the first embodiment. Referring to FIG. 3, the current source 3 is configured to include a PMOS transistor 31 having a source connected to the power supply line $V_{DD}$. A gate of the PMOS transistor 31 is connected to an output terminal of an operational amplifier 33. As shown in FIG. 3, a reference voltage outputted from a bandgap reference circuit 32 is supplied to a non-inversion input terminal of the operational amplifier 33. The bandgap reference circuit 32 is a circuit that serves as a reference voltage source with a very small temperature dependency, and generates a highly accurate constant voltage. The current source 3 further includes a PMOS transistor P1 having a source connected to the power supply line $V_{DD}$, a gate connected to the output terminal of the operational amplifier 33, and a drain connected to one end of a reference resistor 34 and an inversion input terminal of the operational amplifier 33. The other end of the reference resistor 34 is grounded. The operational amplifier 33 operates through a feedback operation in such a way that a voltage of the inversion input terminal is equal to that of the non-inversion input terminal. Accordingly, if the output voltage of the bandgap reference circuit 32 is $V_{BG}$ and the resistance of the reference resistor is $R_{ref}$, a current flowing through the PMOS transistor P1 is $V_{BG}/R_{ref}$. If the PMOS transistor 31 has the same configuration as that of the PMOS transistor P1, the reference current $I_{ref}=V_{BG}/R_{ref}$ is supplied from a drain of the PMOS transistor 31 to the first node N1.

Figure 4:
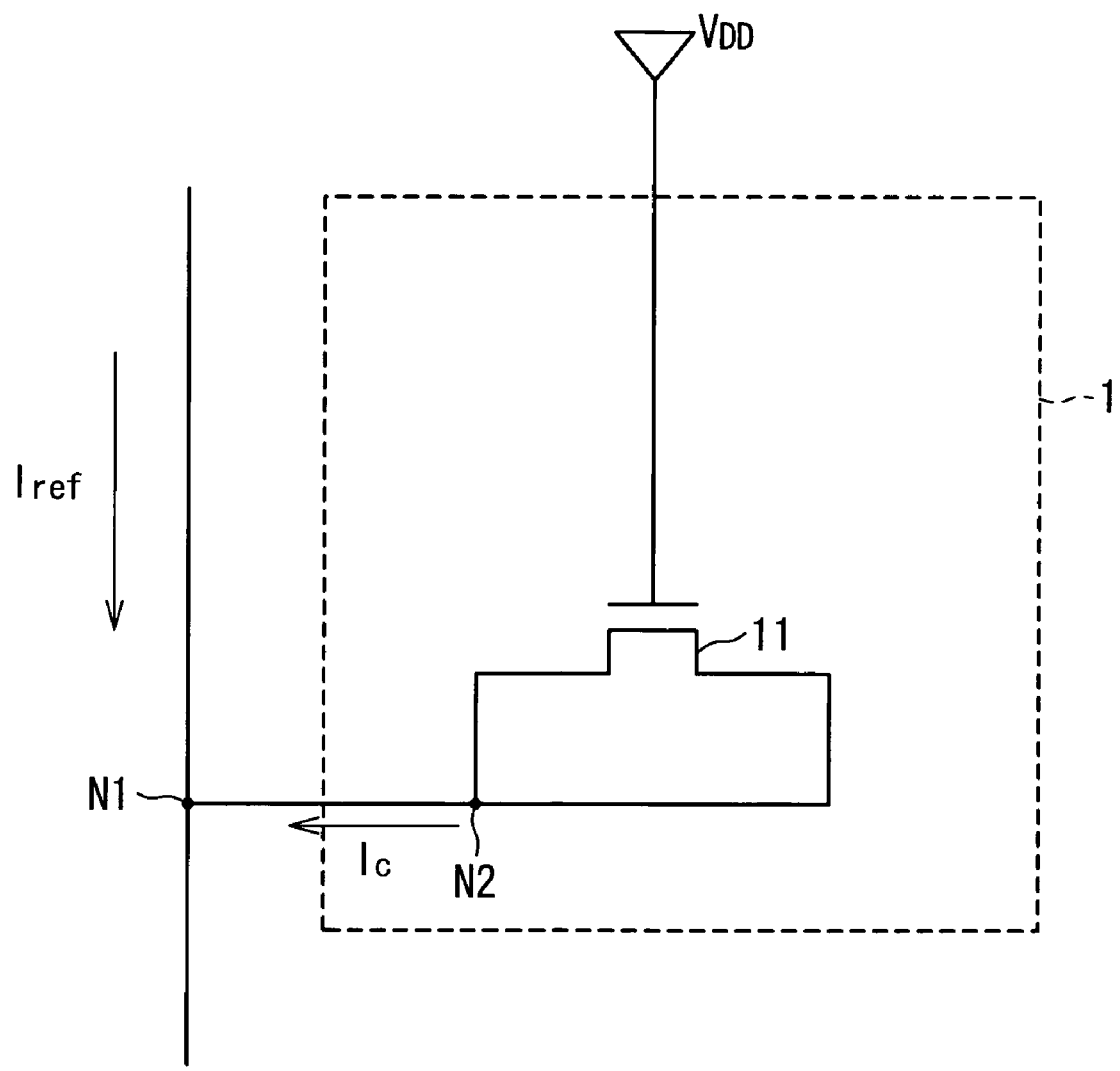
FIG. 4 is a circuit diagram showing the detailed circuit configuration of a compensating circuit in the gate leakage current compensating circuit of the first embodiment.

FIG. 4 is a circuit diagram showing a detailed circuit configuration of the compensating circuit 1 according to the first embodiment. The compensating circuit 1 in the first embodiment is configured to include an NMOS transistor as a compensation transistor 11. As shown in FIG. 4, a gate of the compensation transistor 11 is connected to the power supply line $V_{DD}$. A drain and source of the compensation transistor 11 are short-circuited through a second node N2. The compensation current $I_C$ generated by the compensation transistor 11 is outputted from the second node N2 and supplied to the first node N1. The thickness of a gate insulating film of the compensation transistor 11 is equal to that of each of the transistors 2-0 to 2-n in the current mirror circuit 2, i.e., 5 to 40 angstroms. Therefore, by applying the power supply voltage to the compensation transistor 11, a direct tunnel current flows through the gate of the compensation transistor 11. The compensation transistor 11 can supply the current as the compensation current $I_c$.

It is preferable that a current to be compensated by the compensating circuit 1 is a sum of the gate leakage currents $I_{g0}$ to $I_{gn}$ of the respective MOS transistors 2-0 to 2-n in the current mirror circuit 2. However, the current from the compensating circuit 1 may be at least a part of the sum. The gate leakage current of a MOS transistor is determined based on the thickness of the gate insulating film, the power supply voltage, and the gate area ((gate length L)*(gate width W)). If the gate length of the MOS transistor 2-0 is L0 and the gate width thereof is W0, the gate area of the MOS transistor 2-0 is represented by (gate length L0)×(gate width W0). Likewise, the gate areas of the MOS transistors 2-1 to 2-n are represented by (gate length Ln)×(gate width Wn) (where n is an arbitrary natural number), respectively. If the gate length of the compensation transistor 11 is L11 and the gate width thereof is W11, the gate area of the compensation transistor 11 is represented by L11×W11.

As mentioned above, the gate leakage currents of the plurality of MOS transistors 2-0 to 2-n in the current mirror circuit 2 are determined based on the gate areas of the MOS transistors 2-0 to 2-n, respectively. Accordingly, to compensate for the gate leakage currents, the compensating circuit 1 is configured to include the compensation transistor 11: whose gate area (L11×W11) satisfies a relationship of (L11×W11)=(Sum of gate areas of the respective MOS transistors 2-0 to 2-n).

If the current flowing between the drain and the source of the MOS transistor 2-0 is the constant current $I_{B0}$ shown in FIG. 2, the constant current $I_{B0}$ when the gate leakage currents $I_{g0}$ to $I_{gn}$ flow through the respective MOS transistors 2-0 to 2-n is represented as follows.

(Constant current $I_{B0}$)=(Reference current $I_{ref}$)−((first gate leakage current $I_{g0}$)+(the gate leakage current $I_{g1}$)+ . . . +(the gate leakage current $I_{gn}$))+ (compensation current $I_c$)     (1)

Therefore, by configuring the compensation transistor 11 as mentioned above, the compensation current $I_c$ is desirably represented as follows.

(Compensation current $I_c$)=(first gate leakage current $I_{g0}$)+(the gate leakage current $I_{g1}$)+ . . . +(the gate leakage current $I_{gn}$)     (2)

If the equation (2) is satisfied, the constant current $I_{B0}$ flowing through the MOS transistor 2-0 satisfies a relationship of (Constant current $I_{B0}$)=(Reference current $I_{ref}$). In addition, the constant currents $I_{B1}$ to $I_{Bn}$ flowing through the respective remaining MOS transistors 2-1 to 2-n satisfy the following relationships.

(Constant current $I_{B1}$)=(Constant current $I_{B0}$)=(Reference current $I_{ref}$)

(Constant current $I_{B2}$)=(Constant current $I_{B1}$)=(Reference current $I_{ref}$)

(Constant current $I_{Bn}$)=(Constant current $I_{B0}$)=(Reference current $I_{ref}$)

As can be seen from the above, by supplying the compensation current $I_C$ to the current mirror circuit 2, the current mirror circuit 2 can supply the currents having an accurate ratio to the reference current $I_{ref}$ even if the gate leakage current is supplied to the current mirror circuit 2.

Further, to highly accurately compensate for the gate leakage current, the compensation transistor 11 may be configured by parallel-connected transistors of the same number as the MOS transistors 2-0 to 2-n in the current mirror circuit 2 to have the same configuration as it. Thus, even if the gate leakage currents $I_{g0}$ to $I_{gn}$ of the respective MOS transistors 2-0 to 2-n differ from one another, it is possible to compensate for the gate leakage currents of the current mirror circuit 2 more appropriately.

In the first embodiment, the compensation transistor 11 is the NMOS transistor. However, even if the compensation transistor 11 is a PMOS transistor, there is no difference of the effect between the PMOS transistor and the NMOS transistor. The same thing is true for the compensation circuit if it is a MOS capacitor formed in an N well formed on a P type substrate. As long as the compensation transistor 11 has the gate thickness and the gate area mentioned above, the compensating circuit can generate the appropriate compensation current $I_C$ when a predetermined voltage is applied to the gate of the compensating circuit 1. Therefore, the first embodiment may be easily modified into the current mirror circuit of PMOS transistors. The power supply voltage $V_{DD}$ may be applied to the gate of the compensation transistor 11 through a resistor and a transistor.

Second Embodiment

Figure 5:
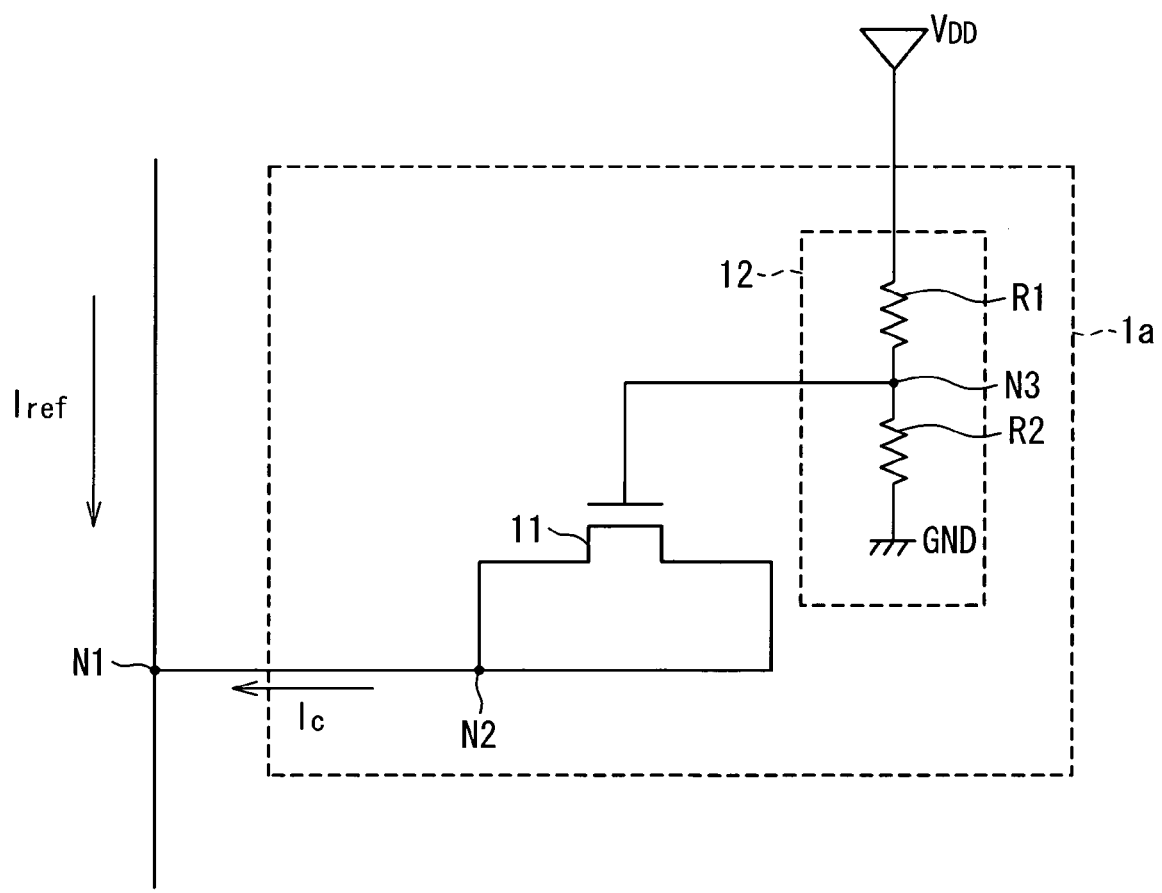
FIG. 5 is a circuit diagram showing the detailed circuit configuration of the compensating circuit in the gate leakage current compensating circuit according to a second embodiment of the present invention.

FIG. 5 is a circuit diagram showing a detailed circuit configuration of a compensating circuit 1a according to the second embodiment. Referring to FIG. 5, the compensating circuit 1a according to the second embodiment is configured to include a voltage adjustment circuit 12 connected to the gate of a compensation transistor 11. As shown in FIG. 5, the voltage adjustment circuit 12 includes a first resistor R1 and a second resistor R2. The first resistor R1 is connected between a third node N3 and the power supply line $V_{DD}$, and the second resistor R2 is connected between the third node N3 and a ground line. A voltage obtained by dividing the power supply voltage by resistances of the resistors R1 and R2 is applied to a gate of the compensation transistor 11.

The thickness of the gate insulating film of the compensation transistor 11 is 5 to 40 angstroms. The compensation current $I_c$ generated by the compensation transistor 11 contains a direct tunnel current as a main part. Therefore, the compensation current $I_c$ does not greatly depend on the predetermined voltage applied to the gate of the compensation transistor 11. Thus, as stated in the first embodiment, the compensation current $I_c$ can be generated by applying the power supply voltage to the gate of the compensation transistor 11.

However, the compensation current $I_c$ depends on the voltage applied to the compensation transistor 11, though being not great. Considering this, by applying a bias having the electric potential difference substantially equal to the voltage difference between the first node N1 and ground when the compensating circuit 1a is not present, to the voltage difference between the gate of the compensation transistor 11 and the second node N2, it is possible to compensate for the gate leakage current of the current mirror circuit 2 more accurately.

As described above, the thickness of the gate insulating film of the compensation transistor 11 is 5 to 40 angstroms. If a high voltage bias is applied to the MOS transistor having a thin gate insulating film, the gate insulating film is often destroyed. Considering this, by allowing the voltage adjustment circuit 12 to adjust the voltage to be applied to the compensation transistor 11, it is possible to prevent the compensation transistor 11 from being destroyed.

In this case, if the first resistor R1 and the second resistor R2 are configured so that an electric potential difference between the third node N3 and the second node N2 of the voltage adjustment circuit 12 is equal in voltage level to the first node N1, it is possible to compensate for the gate leakage current of the current mirror circuit 2 more accurately while preventing destruction of the compensation transistor 11.

Third Embodiment

Figure 6:
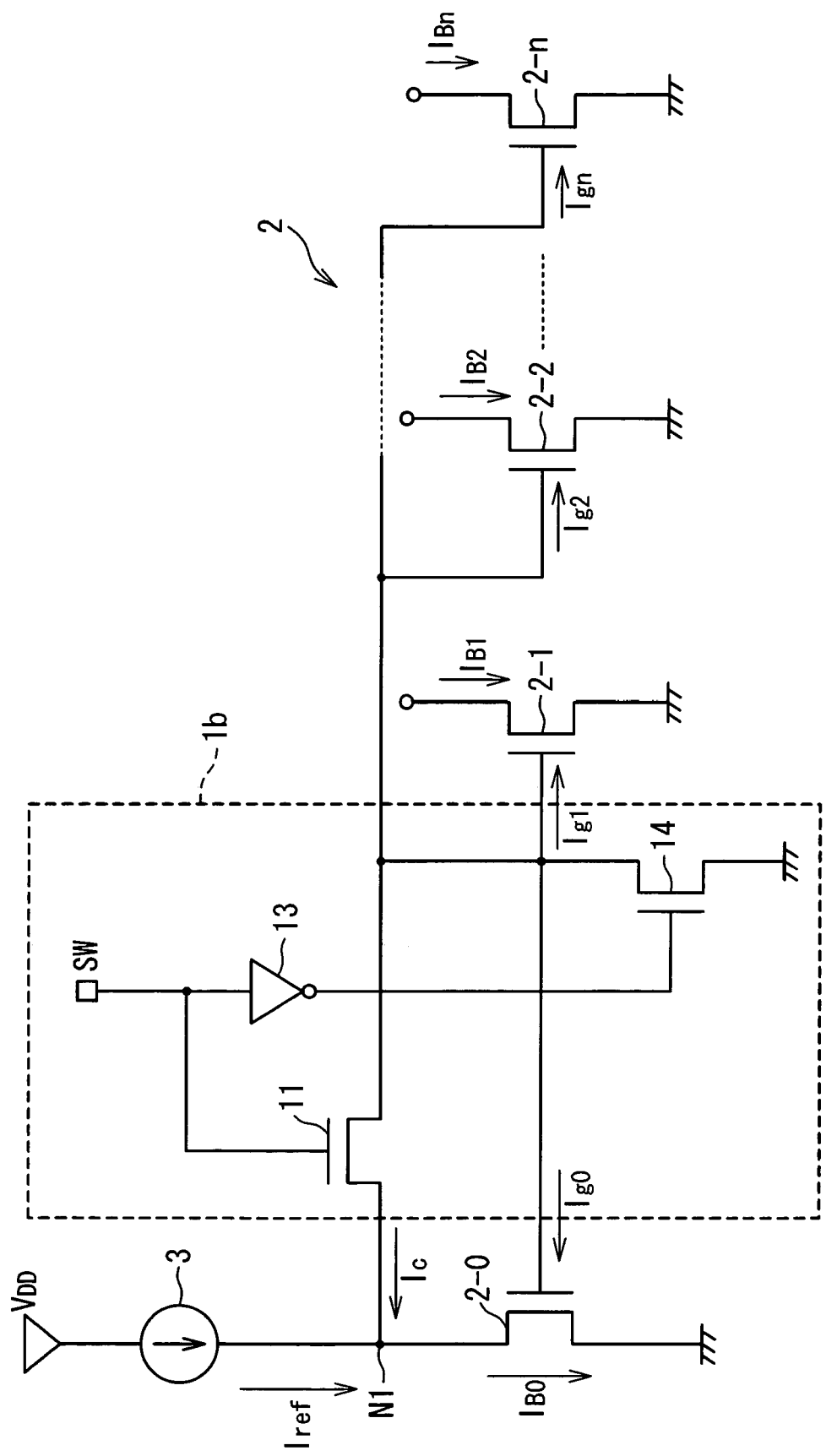
FIG. 6 is a circuit diagram showing the configuration of the compensating circuit in the gate leakage current compensating circuit according to a third embodiment of the present invention.

FIG. 6 is a circuit diagram showing a detailed circuit configuration of a compensating circuit 1b according to a third embodiment. The compensating circuit 1b shown in FIG. 6 has a function of stopping generation of constant currents by the current mirror circuit 2. The compensating circuit may be applied to other embodiments. Referring to FIG. 6, the compensating circuit 1b includes the compensation transistor 11, an inverter 13, and a MOS transistor 14. A high-level or low-level bias is applied from a terminal SW provided in the compensating circuit 1b. It is assumed herein that each of the compensation transistor 11 and the MOS transistor 14 is the NMOS transistor. When the high-level bias is supplied from the terminal SW to the compensation transistor 11, the compensation transistor 11 is turned on. At this time, a low-level bias is outputted from the inverter 13, so that the MOS transistor 14 is turned off. As a result, when the high-level bias is supplied from the terminal SW, a MOS transistor 2-0 and MOS transistors 2-1 to 2-n configures a current mirror circuit.

When the low-level bias is supplied to the terminal SW, the compensation transistor 11 is turned off. At this time, a high-level bias is output from the inverter 13, so that the MOS transistor 14 is turned on. If the MOS transistor 14 is turned on, the gates of the MOS transistors 2-0 to 2-n are pulled down to a ground level, and the MOS transistors 2-0 to 2-n are turned off. As a result, the current mirror circuit 2 is inactivated.

That is, an apparatus that includes a circuit such as a current mirror circuit includes "power-down circuit", i.e., a circuit for inactivating the current mirror circuit so as not to supply current. As shown in FIG. 6, the compensating circuit 1b according to the third embodiment has a power-down function, i.e., a function of operating similarly to the power-down circuit. The compensating transistor 11 of this compensating circuit 1b is constituted by the same MOS transistor as in the first or the second embodiment.

By configuring the compensating circuit 1b to have the power-down function, it is unnecessary to provide a power-down circuit separately from the compensating circuit 1b. Therefore, if a semiconductor device that includes the compensating circuit is to be configured, the semiconductor device can be configured without excessively increasing a circuit area.

Fourth Embodiment

Figure 7:
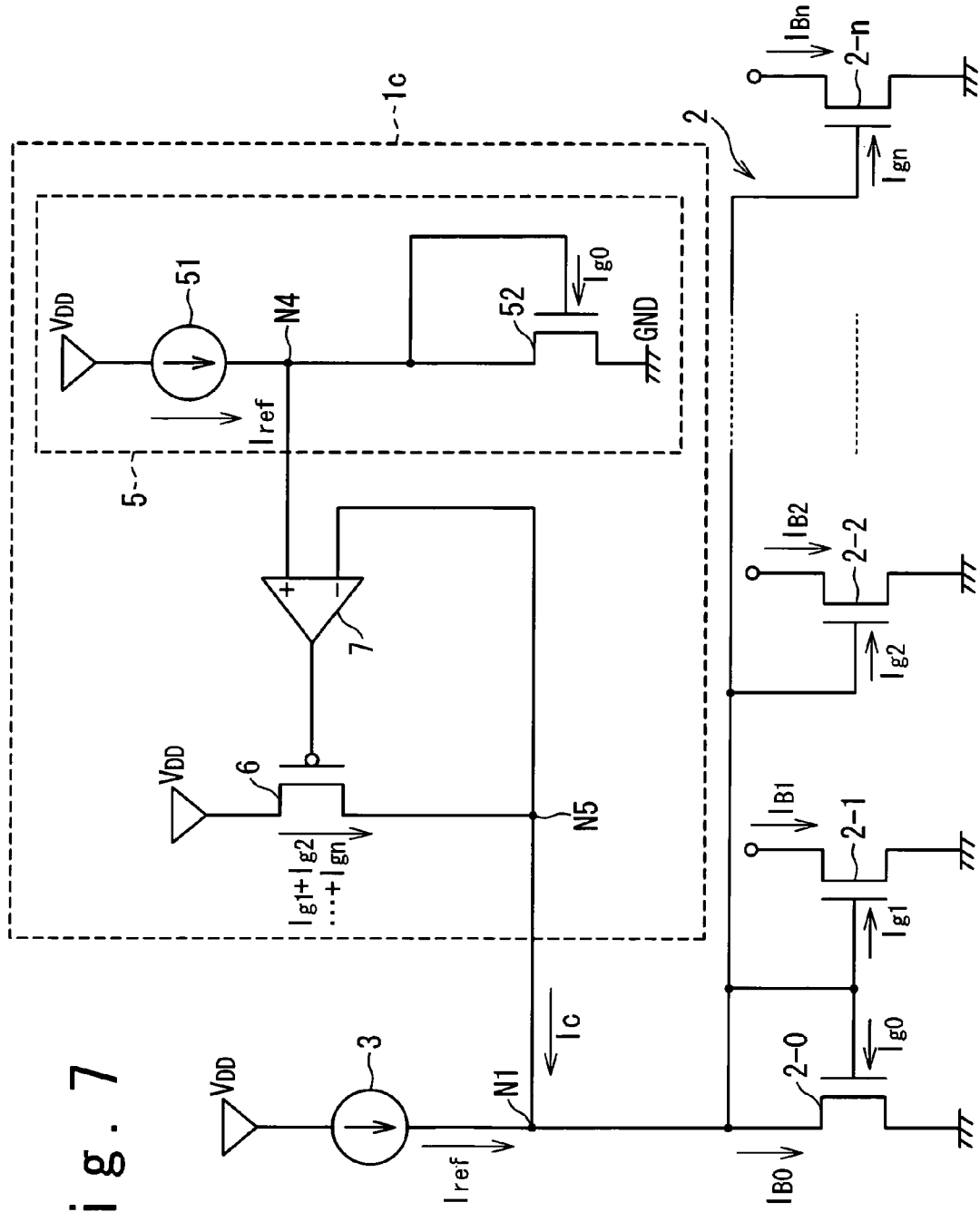
FIG. 7 is a circuit diagram showing the detailed circuit configuration of the compensating circuit in the gate leakage current compensating circuit according to a fourth embodiment of the present invention.

FIG. 7 is a circuit diagram showing a detailed circuit configuration of a compensating circuit 1c according to the fourth embodiment. As shown in FIG. 7, the compensating circuit 1c according to the fourth embodiment includes a reference voltage generating unit 5, a PMOS transistor 6 that supplies the compensation current $I_c$ to the first node N1 from its drain, and an operational amplifier 7. Referring to FIG. 7, the reference voltage generating unit 5 includes a current source 51 and an NMOS transistor 52 connected in series with the current source 5 through a fourth node N4. The NMOS transistor 52 has a gate and a drain connected to each other and has a source connected to a ground line. The current source 51 having the same configuration as the current source 3 supplies a current equal to the reference current $I_{ref}$ to the drain of the NMOS transistor 52. The NMOS transistor 52 has the same configuration as the first NMOS transistor 2-0. A non-inversion input terminal of the operational amplifier 7 is connected to the drain of the NMOS transistor 52, and an inversion input terminal thereof is connected to a drain of the PMOS transistor 6. A gate of the PMOS transistor 6 is connected to an output terminal of the operational amplifier 7, and a source thereof is connected to the power supply line $V_{DD}$.

In the fourth embodiment, the voltage of the fourth node N4 of the reference voltage generating unit 5 is higher than the voltage of the first node N1 if the compensating circuit 1c is not present. The reason is as follows. A drain current of the NMOS transistor 52 is equal to the reference current $I_{ref}$, and a drain current of the MOS transistor 2-0 is smaller than the reference current $I_{ref}$ by a summation of gate leakage currents of the MOS transistors 2-1 to 2-n, i.e., $I_{g1}+I_{g2}+\ldots+I_{gn}$. The operational amplifier 7 operates through a feedback operation in such a way that the voltage of the first node N1 as the voltage on the inversion input terminal is equal to that of the fourth node N4 as the voltage on the non-inversion input terminal. Accordingly, the compensation current $I_C(=I_{g1}+I_{g2}\ldots+I_{gn})$ is supplied from the drain of the PMOS transistor 6 to the first node N1.

According to the fourth embodiment, the operational amplifier compares the drain voltage of the transistor 2-0 when the reference current $I_{ref}$ flows through the first node N1, with the drain voltage when the reference current $I_{ref}$ flows through the drain of the NMOS transistor 52. Based on the comparison result, the compensation current supplied to the drain of the MOS transistor 2-0 can be controlled. In the fourth embodiment, the NMOS transistor 52 has the same configuration as the MOS transistor 2-0 and the current supplied from the current source 51 is equal to the reference current $I_{ref}$. However, the present invention is not limited thereto. As could be understood from the above, the compensating circuit configured to satisfy the following relationship operates similarly.

(Current value of the current source 51):(Reference current $I_{ref}$)=(W/L of the NMOS transistor 52):(W/L of the first MOS transistor 2-0).

As described above, according to the present invention, it is possible to provide a compensating circuit capable of compensating for the gate leakage current without increasing a scale of the compensating circuit and without configuring a complicated circuit.

What is claimed is:

1. A semiconductor device comprising:
    a current mirror circuit comprising a plurality of transistors;
    a current source configured to supply a constant reference current to said current mirror circuit through a node; and
    a current compensating circuit configured to supply a compensation current to said node to compensate for at least a part of gate leakage currents of said plurality of transistors,
    wherein said current compensating circuit comprises:
    a compensating device having an electrode of an area substantially equal to a summation of gate areas of said plurality of transistors, and configured to generate said compensation current based on a predetermined voltage applied to the electrode of said compensating device.

2. The semiconductor device according to claim 1, wherein said compensating device comprises:
    a MOS transistor having a gate as said electrode, and a source and a drain connected to each other and connected to said node.

3. The semiconductor device according to claim 1, wherein said predetermined voltage is a power supply voltage.

4. The semiconductor device according to claim 1, wherein said current compensating circuit further comprises:
    a voltage adjusting circuit comprising first and second resistances connected in series and configured to generate an adjustment bias voltage from a power supply voltage by said first and second resistances and to supply said adjustment bias voltage to said compensating device as said predetermined voltage.

5. A semiconductor device comprising:
    a current mirror circuit comprising a plurality of transistors;
    a current source configured to supply a constant reference current to said current mirror circuit through a node; and
    a compensating circuit configured to supply a compensation current to said node to compensate for at least a part of gate leakage currents of said plurality of transistors,
    wherein said compensating circuit comprises:
    a current supply circuit; and
    a control circuit configured to control said current supply circuit based on an output voltage of said current supply circuit and a reference voltage at a reference node such that said current supply circuit supplies said compensation current to said node.

6. The semiconductor device according to claim 5, wherein said compensating circuit further comprises:
    a reference voltage generating circuit configured to supply a current equal to said constant reference current to said reference node; and
    a MOS transistor having a drain connected with said reference node, a gate connected with said drain and a source connected with a ground.

7. The semiconductor device according to claim 5, wherein said control circuit compares the output voltage of said current supply circuit and the reference voltage at said reference node and controls said current supply circuit based on the comparing result.

8. A method of suppressing gate leakage currents, comprising:
    supplying a constant reference current from a current source to a current mirror circuit of a plurality of transistors through a node; and
    supplying a compensation current from a compensating circuit to said current mirror circuit through said node to compensate for at least a part of gate leakage currents of said plurality of transistors,
    wherein said compensating circuit comprises:
    a compensating device having an electrode of an area substantially equal to a summation of gate areas of said plurality of transistors, and
    said supplying the compensation current comprises:
    generating said compensation current based on a predetermined voltage applied to the electrode of said compensating device.

* * * * *